(12) United States Patent
Yoshida et al.

(10) Patent No.: US 7,825,406 B2
(45) Date of Patent: Nov. 2, 2010

(54) ORGANIC EL DEVICE

(75) Inventors: Hidehiro Yoshida, Osaka (JP);
Kiyotaka Mori, Cambridge (GB);
Shinya Ono, Osaka (JP); Keisei Yamamuro, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/375,782

(22) PCT Filed: May 30, 2008

(86) PCT No.: PCT/GB2008/001828

§ 371 (c)(1),
(2), (4) Date: Jan. 30, 2009

(87) PCT Pub. No.: WO2008/145999

PCT Pub. Date: Dec. 4, 2008

(65) Prior Publication Data

US 2009/0321725 A1  Dec. 31, 2009

(30) Foreign Application Priority Data

May 31, 2007  (JP)  ............... 2007-144807

(51) Int. Cl.
*H01L 35/24* (2006.01)
*H01L 51/00* (2006.01)
(52) U.S. Cl. .............. 257/40; 257/59; 257/72
(58) Field of Classification Search ............ 257/40, 257/59, 72, E51.001
See application file for complete search history.

(56) References Cited

U.S. PATENT DOCUMENTS 6,023,308 A   2/2000  Takemura

| 7,166,242 B2 | 1/2007 | Seki et al. |
| 7,683,368 B2 * | 3/2010 | Shinohara et al. ............ 257/40 |
| 2004/0079923 A1 | 4/2004 | Yamazaki et al. |
| 2004/0123804 A1 | 7/2004 | Yamazaki et al. |
| 2005/0285540 A1 | 12/2005 | Koo et al. |
| 2008/0042584 A1 * | 2/2008 | Ohtani ..................... 315/169.3 |
| 2008/0057602 A1 | 3/2008 | Yamazaki et al. |

(Continued)

FOREIGN PATENT DOCUMENTS

DE   10 2004 05939   9/2006

(Continued)

OTHER PUBLICATIONS

Japanese Office Action dated Nov. 17, 2009 that issued with respect to patent family member Japanese Patent Application No. 2009-515967.

(Continued)

*Primary Examiner*—Phuc T Dang
(74) *Attorney, Agent, or Firm*—Greenblum & Bernstein, P.L.C.

(57) ABSTRACT

An organic EL device comprising a semiconductor element A having a source electrode, a drain electrode, and a gate electrode, a semiconductor element B having a source electrode, a drain electrode, and a gate electrode connected to the source electrode or the drain electrode of the semiconductor element A, and an organic EL element having a pixel electrode connected to the drain electrode of the semiconductor element B, in which the source electrode and the drain electrode of the semiconductor element A and the gate electrode of the semiconductor element B are set on the same plane.

7 Claims, 14 Drawing Sheets

U.S. PATENT DOCUMENTS

2008/0266227 A1* 10/2008 Arasawa et al. ............... 345/89

FOREIGN PATENT DOCUMENTS

| DE | 102004059396 | 9/2006 |
| --- | --- | --- |
| EP | 1087448 | 3/2001 |
| EP | 1478212 | 11/2004 |
| EP | 1 818 900 | 8/2007 |
| EP | 1 918 996 | 5/2008 |
| JP | 2000056847 | 2/2000 |
| JP | 2000-340358 | 12/2000 |
| JP | 2001195009 | 7/2001 |
| JP | 2003-223120 | 8/2003 |
| JP | 2003-249375 | 9/2003 |
| JP | 2004-127897 | 4/2004 |
| JP | 2004-146369 | 5/2004 |
| JP | 2005-150641 | 6/2005 |
| JP | 2005-202194 | 7/2005 |
| JP | 2005-286278 | 10/2005 |
| JP | 2007-073311 | 3/2007 |

OTHER PUBLICATIONS

English language Abstract and partial English language translation of JP 2003-223120, Aug. 8, 2003.
United Kingdom Office Action dated Dec. 9, 2009 that issued with respect to United Kingdom Application No. GB 0901591.8.
English language Abstract of JP 2007-073311. (Mar. 22, 2007).
English language Abstract and partial English translation of JP 2004-146369. (May 20, 2004).
English language Abstract of JP 2005-286278. (Oct. 13, 2005).
English language Abstract of JP 2000-340358. (Dec. 8, 2000).
English language Abstract of JP 2004-127897. (Apr. 22, 2004).
English language translation of patent abstract 2003-249375, (Sep. 5, 2003).
English language translation of patent abstract 10 2004 059396, (Feb. 26, 2004).
English language translation of patent abstract 2005-150641 (Jun. 9, 2005).
English language translation of patent abstract 2005-202194, (Jul. 28, 2005).

* cited by examiner

ORGANIC EL DEVICE

This application is a National Phase under 35 U.S.C. §371 of PCT/GB2008/001828, filed May 30, 2008.

TECHNICAL FIELD

The present invention relates to an Organic Electro-Luminescence (OEL) device and manufacturing method thereof and particularly to an OEL display.

BACKGROUND ART

An OEL device, which is a component of an OEL display, generally has an OEL element and a thin film transistor (TFT) for driving the OEL element. A general OEL device has a driving transistor (driving TFT) for driving the OEL element and a switching transistor (switching TFT) for turning on/off the driving transistor.

As an example of typical structure of the OEL device, a top-emission structure in which an OEL element is laminated on a transistor is known (See Patent Document 1, for example). Such an OEL device is called a top-emission type OEL device and emits light from a light emitting layer through a seal film set at the opposite side to a substrate.

FIG. 1 shows a structure of a conventional top-emission type OEL device described in Patent Document 1. In the top-emission type OEL device shown in FIG. 1, a source region 141a of a thin film transistor 123 (driving TFT) for driving is connected to a pixel electrode 111 through a contact hole 145. A drain region 141b of the thin film transistor 123 is connected to a thin film transistor (switching TFT) 142 for switching through a power line 103 provided at a contact hole 146.

In FIG. 1, the thin film transistor 142 for switching connected to the thin film transistor 123 for driving is not shown.

Patent Document 1: Japanese Patent Laid-open Publication No. 2003-249375

DISCLOSURE OF THE INVENTION

Problems to be Solved by the Invention

However, it is sometimes difficult to connect the switching TFT and the driving TFT through the contact hole (connecting work) as in the above conventional OEL device configuration. Particularly in a high-definition active OEL display, the connection through the contact hole is one of factors for lower yield.

The present invention solves the above conventional problem and has an object to ensure connection between the driving transistor and the switching transistor more securely and to improve yield at the same time.

Further, the present invention has an object to provide an OEL display with high response and manufacturing method thereof.

Means for Solving the Problems

The present invention first relates to an OEL device described below:

[1] An organic EL device comprising a semiconductor element A having a source electrode, a drain electrode, and a gate electrode, a semiconductor element B having a source electrode, a drain electrode, and a gate electrode connected to the source electrode or the drain electrode of the semiconductor element A, and an organic EL element having a pixel electrode connected to the drain electrode of the semiconductor element B, in which the source electrode and the drain electrode of the semiconductor element A and the gate electrode of the semiconductor element B are set on the same plane.

[2] The organic EL device described in [1], in which the semiconductor element A is a top-gate type TFT and the semiconductor element B is a bottom-gate type TFT.

[3] The organic EL device described in [1], in which the semiconductor element A is a bottom-gate type TFT and the semiconductor element B is a top-gate type TFT.

[4] The organic EL device described in any of [1] to [3], in which a semiconductor layer of the semiconductor element A or the semiconductor element B contains silicon.

[5] The organic EL device described in any of [1] to [3], in which a semiconductor layer of the semiconductor element A or the semiconductor element B contains an organic semiconducting material.

[6] The organic EL device described in any of [1] to [3], in which semiconductor layers of the semiconductor element A and the semiconductor element B each contain an organic semiconducting material and the organic semiconducting material contained in the semiconductor layer of the semiconductor element A and the organic semiconducting material contained in the semiconductor layer of the semiconductor element B are different from each other.

The present invention secondly relates to an organic EL display described below:

[7] An organic EL display in which the organic EL devices in any kind of [1] to [6] are arranged in a matrix state on a single substrate, in which a scanning electrode line connected to the gate electrode of each semiconductor element A and a common electrode line connected to the source electrode of each semiconductor element B are parallel to the X axis, while a data electrode line connected to the source electrode of each semiconductor element A is parallel to the Y axis, and the X axis and the Y axis bisect each other at right angle.

The present invention thirdly relates to a manufacturing method of an organic EL device described below:

[8] A manufacturing method of an organic EL device having a step of providing a substrate, a step of forming a source electrode and a drain electrode of a semiconductor element A, a gate electrode of a semiconductor element B, and a contact portion for connecting the source electrode or the drain electrode of the semiconductor element A and the gate electrode of the semiconductor element B on the same plane of the substrate, a step of forming a semiconductor layer of the semiconductor element A for connecting the source electrode and the drain electrode of the semiconductor element A, a step of forming a gate insulating film on the source electrode, the drain electrode and the semiconductor layer of the semiconductor element A as well as the gate electrode of the semiconductor element B, a step of forming a gate electrode of the semiconductor element A, and a source electrode and a drain electrode of the semiconductor element B on the gate insulating film, a step of forming a semiconductor layer of the semiconductor element B for connecting the source electrode and the drain electrode of the semiconductor element B, and a step of forming a pixel electrode of an organic EL element connected to the drain electrode of the semiconductor element B.

EFFECT OF THE INVENTION

According to the present invention as mentioned above, since an element A (switching TFT) and an element B (driving TFT) are connected not through a contact hole, connecting work is further ensured and yield can be improved.

Further, since the contact hole is not required in the present invention, line of electrodes in each element can be made thick.

Moreover, by making a positional relation of the gate electrode of the element A to the source electrode and the drain electrode, and a positional relation of the gate electrode of the element B to the source electrode and the drain electrode different from each other (one as a top gate and the other as a bottom gate), the number of lines of electrodes on the substrate (the source electrode of the element A, the drain electrode of the element A, and the gate electrode of the element B) and the number of lines of electrodes on the insulating film (the gate electrode of the element A, the source electrode of the element B, and the drain electrode of the element B) can be averaged, and the lines of the source electrodes and the drain electrodes of the element A and the element B can be made further thicker. As a result, response of the OEL device can be improved.

BEST MODE FOR CARRYING OUT THE INVENTION

Figure 1:
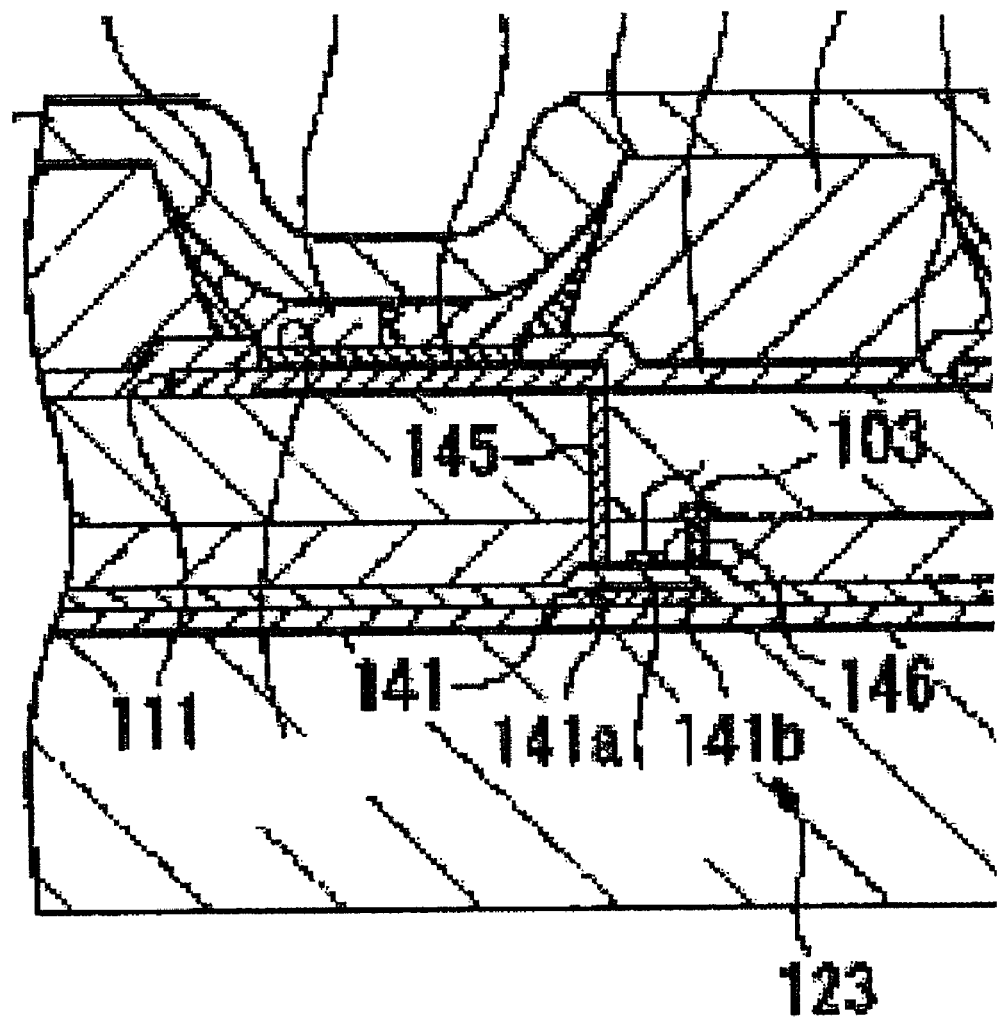
FIG. 1 is a sectional view of a conventional OEL device.

1. The OEL (Organic Electro-Luminescence) Device of the Present Invention

The OEL device of the present invention has a semiconductor element A (hereinafter referred to as "element A"), a semiconductor element B (hereinafter referred to as "element B"), and an OEL element having a pixel electrode connected to a drain electrode of the element B. A source electrode or a drain electrode of the element A and a gate electrode of the element B are connected. The OEL device of the present invention may be either a top-emission type or a bottom-emission type, and the top-emission type is preferable.

(1) Element A

The element A in the semiconductor device of the present invention has a source electrode, a drain electrode, a semiconductor layer, and a gate insulating film. The element A functions as a switching TFT in the OEL device of the present invention. The switching TFT is a TFT for selecting a pixel. When the switching TFT is turned on, its potential is held at retention volume, and a state of on/off of the driving TFT (element B), which will be described later, is controlled according to a capacity of the retention volume. The element A may be either a top-gate type TFT or a bottom-gate type TFT, and the top-gate type TFT is preferable.

The substrate is a substrate made of an insulating material. Examples of the insulating material include glass and resin. Examples of the resin include polyethyleneterephthalate (PET), polyethylenenaphthalate (PEN), polyethersulfone (PES), polyetherimide, polyphenylenesulfide (PPS), polyarylate, polyimide, polycarbonate (PC), polyacrylate (PAR), cellulosetriacetate, celluloseacetatepropionate (CAP) and the like.

If the element A is a top-gate type TFT, the source electrode and the drain electrode, which will be described later, are set nearer the substrate than the gate electrode (See FIG. 5). On the other hand, if the element A is a bottom-gate type TFT, the gate electrode is set nearer the substrate than the source electrode and the drain electrode (See FIG. 7).

Materials of the source electrode and the drain electrode may be either conductive polymer or low-resistance metal. Examples of the conductive polymer include polythiophene derivative, polyethylenedioxythiophene (PEDOT), polyaniline (PANI) and the like. Examples of the metal include aluminum (Al), chromium (Cr), molybdenum (Mo), gold (Au), silver (Ag), copper (Cu), platinum (Pt) and the like. In the case of the top-emission type OEL device of the present invention, the material of the source electrode and the drain electrode is preferably silver having high light reflectance. Additionally, the source electrode and the drain electrode may be made into a thin film or laminated to have a low stress. The source electrode and the drain electrode may be formed by gas phase methods such as sputtering method, deposition method and the like or liquid phase methods such as application of a liquid-state electrode material, for example.

The source electrode and the drain electrode may be laminated on a Cr film (5 nm or less) or on a Ti film (5 nm or less). By laminating the source electrode and the drain electrode on the Cr film or the Ti film, adhesion between the source electrode as well as the drain electrode and the substrate or the insulating film is improved. Moreover, since the Ti film is hard to be oxidized, the source electrode and the drain electrode are preferably laminated on the Ti film.

The source electrode or the drain electrode of the element A is connected to the gate electrode of the element B, which will be described later, through a contact portion. The present invention is characterized in that the source electrode and the drain electrode of the element A, the gate electrode of the element B, and the contact portion are set on the same plane. That is, the source electrode or the drain electrode of the element A, and the gate electrode of the element B are connected to each other on the same plane.

The contact portion is a conductive layer for connecting the source electrode or the drain electrode of the element A and the gate electrode of the element B to each other. The material of the contact portion may be MoCr, APC (alloy of Ag, Pd, and Cu), NiCr and the like, for example. The contact portion is preferably formed at the same time with the source electrode and the drain electrode of the element A and the gate electrode of the element B.

Figure 11A:
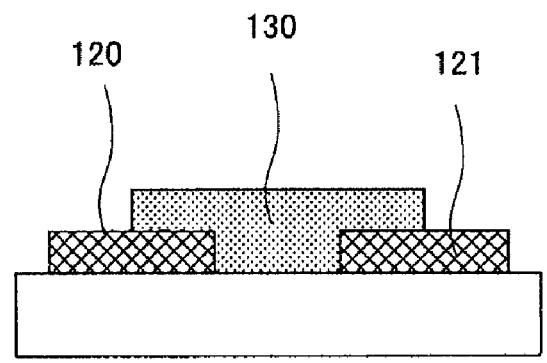
FIG. 11 is a sectional view of a TFT in the OEL device of the present invention.
Figure 11B:
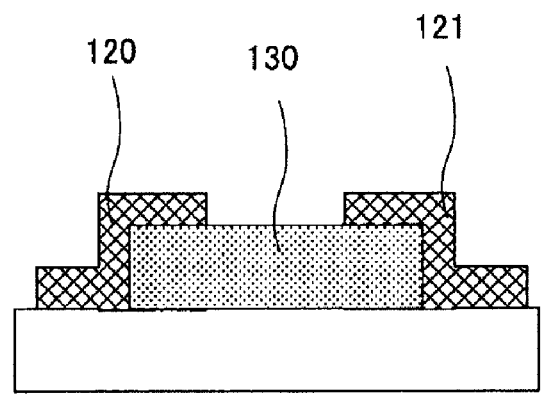

The semiconductor layer is set between the source electrode and the drain electrode, and electrically connects the source electrode and the drain electrode to each other. The semiconductor layer may be set on the source electrode and the drain electrode (FIG. 11A) or set below the source electrode and the drain electrode (FIG. 11B). If the semiconductor layer is formed below the source electrode and the drain electrode (See FIG. 11B), in order to reduce contact resistance or to control an off-leak current, a contact face of the semiconductor layer with the source electrode and the drain electrode may be doped with a doping material.

The semiconductor layer may be a silicon based semiconductor layer, an organic semiconductor layer or a compound semiconductor layer.

The silicon based semiconductor layer may be polysilicon, amorphous silicon, micro-crystal silicon, nano-crystal silicon, polymorphous silicon and the like. The silicon based semiconductor layer is formed by a CVD method such as direct film-forming method (parallel flat-plate RF method, micro-wave plasma method, inductively coupled plasma method and the like) or solid-phase growth method (method using magnetic annealing, catalyst annealing, laser annealing and the like after film formation), for example.

If the element A is a top-gate type TFT, the silicon based semiconductor layer is preferably formed by a solid-phase growth method using a laser annealing method. If the silicon based semiconductor layer is formed by the laser annealing method, crystallization of an upper layer in the semiconductor layer might be promoted. In the case of the top-gate type TFT, since the upper layer in the semiconductor layer is subject to an influence of the gate electrode, the silicon based semiconductor layer with a crystallized upper layer is suitable for the top-gate type TFT.

Figure 9:
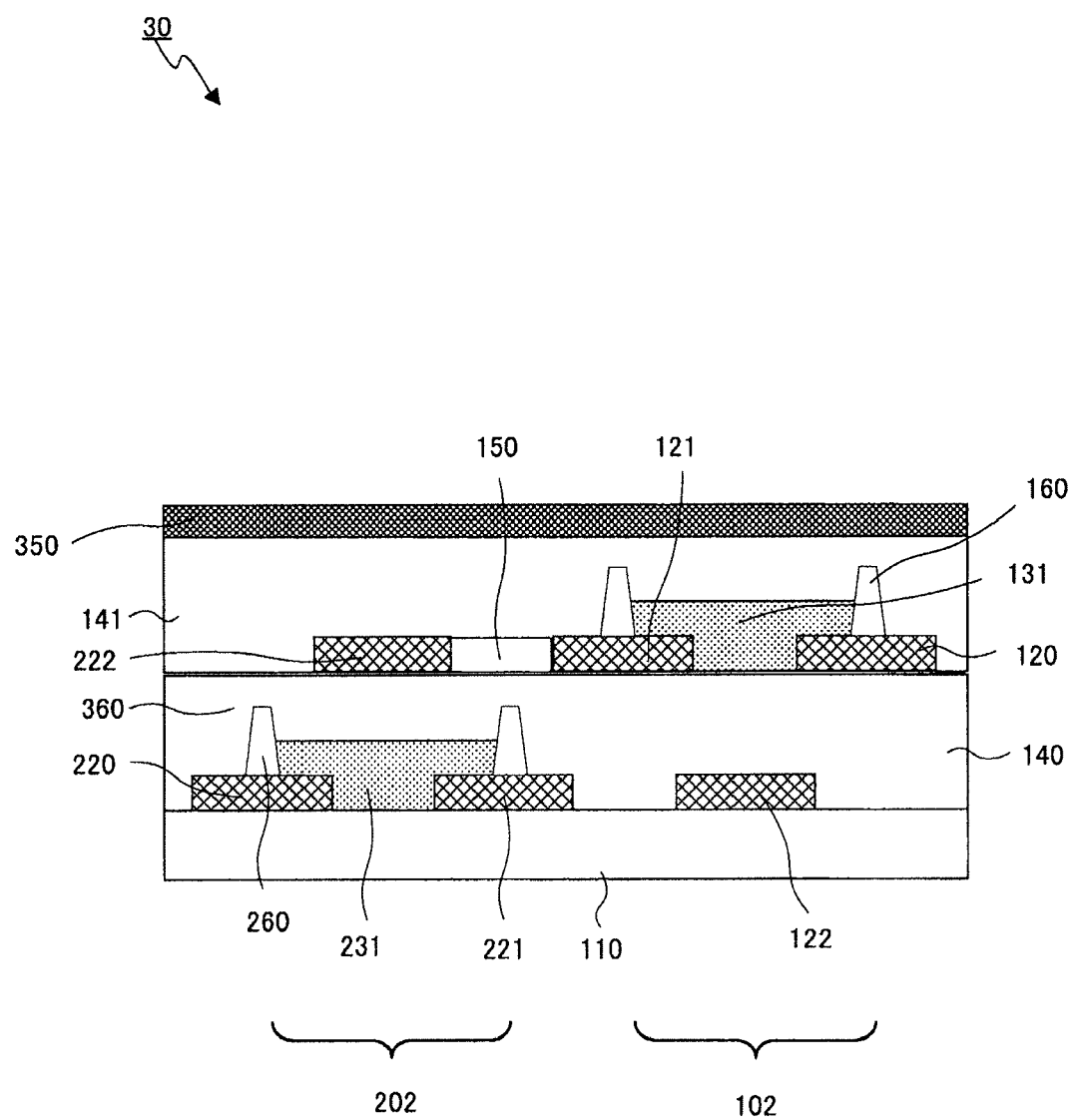
FIG. 9 is a sectional view of the OEL device of a third embodiment of the present invention.

On the other hand, the organic semiconductor layer is formed by applying an organic semiconducting material in a region defined by a bank provided on the electrode (See FIG. 9). Specifically, the semiconductor layer is preferably formed by applying a non-aqueous solution such as ethyl benzoate containing the organic semiconducting material and drying it. Examples of coating method include an ink-jet method, a dispense method and the like. The semiconductor layer containing the organic semiconducting material is preferably polycrystalline and excellent in electrical characteristics.

The bank defining the region of the organic semiconductor layer has a role to prevent leakage of the organic semiconducting material to an adjacent element when the organic semiconducting material is applied by a printing method such as the ink-jet method and the like. The bank may be formed by gravure printing method using the gravure printing device shown in FIG. 2.

Figure 2:
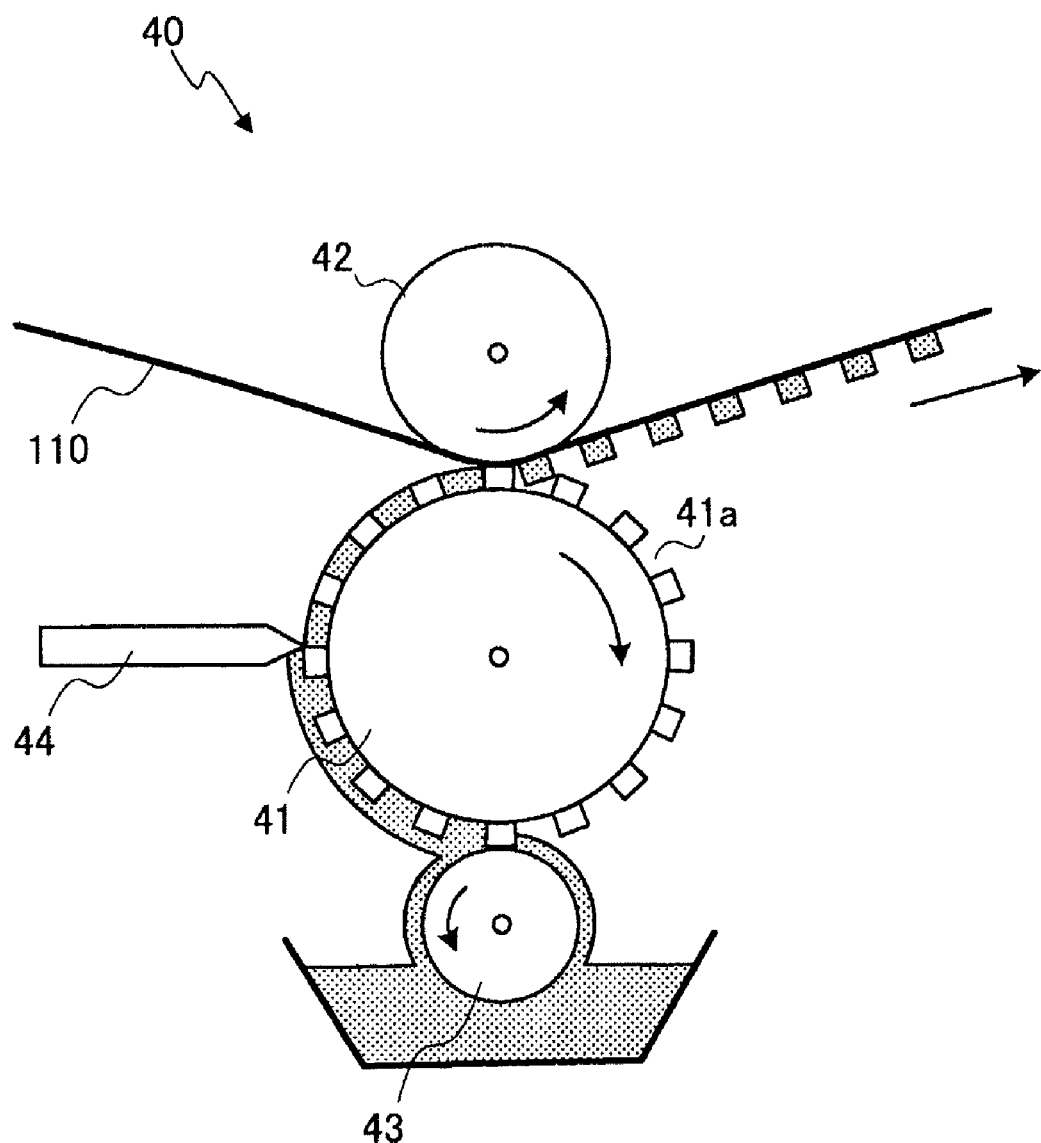
FIG. 2 is a schematic diagram of a gravure printing device.

FIG. 2 shows a gravure printing device 40. The gravure printing device 40 has a printing roll 41, an impression cylinder roll 42, an ink supply roll 43, and a doctor 44.

The printing roll 41 has a roll face 41a on its surface on which a printing pattern is formed. The impression cylinder roll 42 has a function to bring a substrate 110 into contact with the printing roll 41. The ink supply roll 43 is a roll for supplying ink to the printing roll 41. The doctor 44 has a function to control the ink supplied by the ink supply roll 43 to the printing roll 41 at a constant volume.

In the gravure printing device 40, the substrate 110 is set so as to pass between the printing roll 41 and the impression cylinder roll 42 only in an arrow direction in the figure.

A method of forming a bank by gravure printing method will be described below.

First, the printing roll 41, the impression cylinder roll 42, and the supply roll 43 placed within a tank (no reference numeral) in which a resin material (bank material) is stored are rotated, respectively, and the resin material is supplied into a recess portion in the roll face 41a of the printing roll 41. At this time, the volume of the supplied resin material is preferably made constant by the doctor 44. Then a desired position on the surface of the substrate 110 was brought in contact with a printing roll 41 by the impression cylinder roll.

And the resin material filled in the recess portion of the roll face 41a is transferred on the desired position of the surface of the substrate 110 so as to form a bank.

Hydrophilic property and hydrophobic property of the bank may be controlled further by carrying out plasma processing using oxygen plasma and $CF_4$ plasma to the formed bank. The plasma processing with oxygen plasma contributes to uniform application of the organic semiconducting material by making a region on which the organic semiconducting material is applied hydrophilic. On the other hand, the plasma processing with $CF_4$ plasma prevents protrusion of the applied organic semiconducting material from the region defined by the bank by making the bank surface hydrophobic.

Examples of the organic semiconducting material include fluorene-thiophene copolymer (F8T2), tetrabenzoporphyrin, oligothiophene, pentacene, rubrene, carbon nanotube and the like.

In the case of the organic semiconductor layer, it is necessary to select the organic semiconducting material appropriately depending on a positional relation of the gate electrode to the source electrode and the drain electrode. That is because the type of the organic semiconducting material constituting the channel to be controlled might be different depending on the position of the gate electrode. For example, if the element A is the top-gate type TFT, the organic semiconducting material may be fluorene-thiophene copolymer (F8T2) oligothiophene, pentacene, rubrene and the like, and rubrene is particularly preferable. On the other hand, if the element A is the back-gate type TFT, the organic semiconducting material is preferably tetrabenzoporphyrin.

The gate insulating film is a member for insulating the gate electrode from the source electrode and the drain electrode. If the element A is the top-gate type TFT, the gate insulating film is provided on the source electrode and the drain electrode as well as the semiconductor layer (See FIG. 5). On the other hand, if the element A is the bottom-gate type TFT, the gate insulating film is set on the gate electrode, which will be described later (See FIG. 7).

The material of the gate insulating film is preferably silicon nitride, silicon oxide, silicon nitride oxide and the like but not limited to them. The material of the gate insulating film may be a metal oxide or insulating organic substance that offers a clean interface with the semiconductor layer and has smaller leak current. Examples of the insulating organic substance include polyimide, acrylic, cyclotene, polystyrene based materials and the like.

The gate electrode is a conductive layer for controlling a current flowing between the source electrode and the drain electrode.

The material of the gate electrode is not particularly limited, but it may be a laminate film of an Au film (approximately 100 nm) and a Cr film (5 nm or less) or a Ti film (5 nm or less), for example. By laminating the gate electrode on the Cr film or the Ti film, adhesion between the gate electrode and the substrate or the insulating film is improved. Moreover, since the Ti film is hardly oxidized, the gate electrode is preferably laminated on the Ti film.

(2) Element B

The element B has a gate electrode, a gate insulating film, a source electrode, a drain electrode, and a semiconductor layer similar to the element A. The function and material of respective parts may be the same as those of the element A. In the OEL device of the present invention, the element B functions as the driving TFT. The driving TFT is a TFT for driving the OEL element.

In the present invention, the element B preferably shares the substrate and the gate insulating film with the element A. In addition, the drain electrode of the element B is connected to the pixel electrode of the OEL element. A method for connecting the drain electrode of the element B and the pixel electrode of the OEL element is not particularly limited. For example, if the OEL element is the top-emission type, the drain electrode of the element B and the pixel electrode of the OEL element may be connected to each other through a contact hole.

(3) Manufacturing Method of Each Element

The manufacturing method of each element is different depending on whether it is the top-gate type TFT or the bottom-gate type TFT. The manufacturing method of the element will be described below respectively for a case when the element is the top-gate type TFT and for a case of the bottom-gate type TFT.

a) In the Case when the Element is a Top-Gate Type TFT

A manufacturing method of the top-gate type TFT has steps of i) providing a substrate; ii) forming a source electrode and a drain electrode on the substrate; iii) forming a semiconductor layer on the substrate; iv) forming a gate insulating film on the semiconductor layer, the source electrode and the drain electrode; and v) forming a gate electrode on the gate insulating film, for example.

The ii) step may come before the iii) step or after the iii) step.

b) In the Case when the Element is a Bottom-Gate Type TFT

The manufacturing method of the bottom-gate type TFT has steps of i) providing a substrate; ii) forming a gate electrode on the substrate; iii) forming a gate insulating film on the gate electrode; iv) forming a source electrode and a drain electrode on the gate insulating film; and v) forming a semiconductor layer on the gate insulating film, for example.

The iv) step may come before the v) step or after the v) step.

(4) Relation Between the Element A and the Element B

As mentioned above, the gate electrode of the element B is formed on the same plane as the source electrode and the drain electrode of the element A and is electrically connected to the source electrode or the drain electrode of the element A.

As mentioned above, in the OEL device of the present invention, by setting the source electrode as well as the drain electrode of the element A and the gate electrode of the element B on the same plane, the element A (switching TFT) and the element B (driving TFT) can be connected to each other not through a contact hole, and yield can be improved.

In order to form the source electrode and the drain electrode of the element A, and the gate electrode of the element B on the same plane, for example, (1) a method of making the element A be the top-gate type and making the element B be the bottom-gate type, and setting the source electrode as well as the drain electrode of the element A and the gate electrode of the element B on the same plane of the substrate (See FIG. 5), (2) a method of making the element A be the bottom-gate type and the element B be the top-gate type, and setting the source electrode as well as the drain electrode of the element A and the gate electrode of the element B on the same plane of the insulating film (See FIG. 9) and the like may be used.

As mentioned above, in the present invention, the positional relation of the gate electrode of the element A to the source electrode and the drain electrode, and the positional relation of the gate electrode of the element B to the source electrode and the drain electrode are preferably made different from each other (the one is made a top gate and the other a drain gate).

If the drain electrode of the element B is to be connected to the pixel electrode of the OEL element through the contact hole, preferably the element A is the top-gate type and the element B is the bottom-gate type. That is because by making the element A be the top-gate type and the element B be the bottom-gate type, the drain electrode of the element B and the pixel electrode of the OEL element can be connected to each other by a shorter contact hole.

As mentioned above, by making one of the elements be the top-gate type and the other be the bottom-gate type, the number of electrodes on the substrate and the number of electrodes on the insulating film can be averaged.

Figure 3:
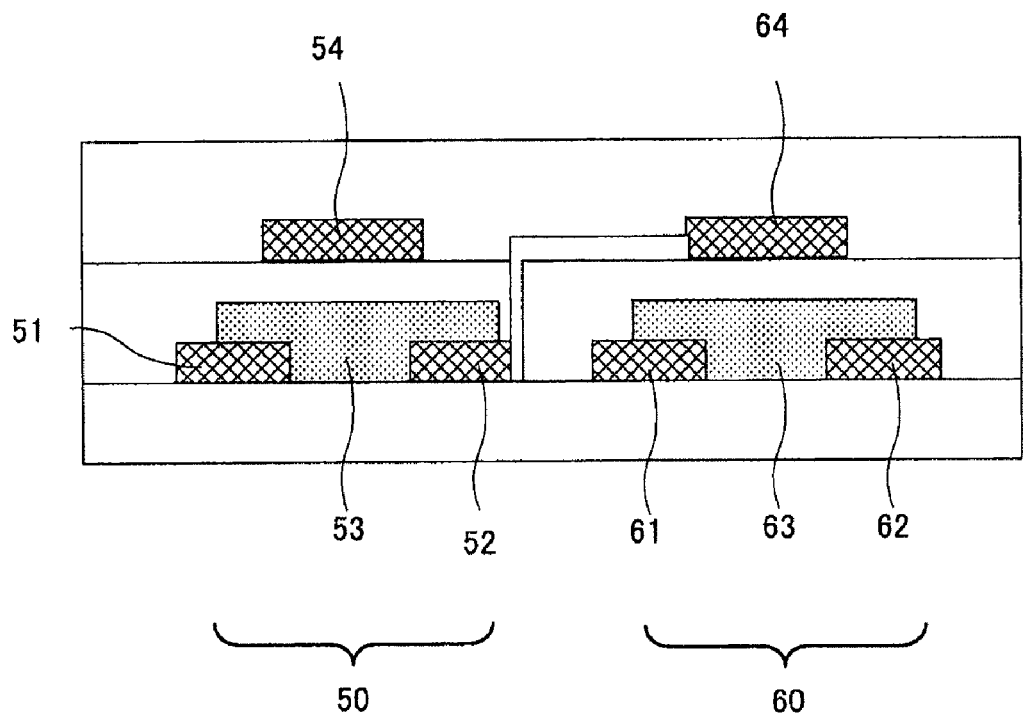
FIG. 3 is a schematic diagram of a conventional OEL device.

For example, if the element A is made the top-gate type TFT and the element B is also made the top-gate type TFT as in the conventional OEL device shown in FIG. 3, the number of electrodes set on the substrate is (1) the source electrode of the element A, (2) the drain electrode of the element A, (3) the source electrode of the element B, and (4) the drain electrode of the element B, totaling 4, while the number of electrodes set on the insulating film is the gate electrode of the element A and the gate electrode of the element B, totaling 2 (See FIG. 3). On the other hand, as in the present invention, by making the positional relation of the gate electrodes in the element A and the element B different (one in the top gate and the other in the bottom-gate type), the number of electrodes set on the substrate and the number of electrodes set on the insulating film are 3, respectively.

By this structure, the widths of the line of the source electrode and the drain electrode of the element B can be enlarged.

Usually, the driving TFT needs to have a source electrode and a drain electrode with large current capacities in order to pass a large driving current flow to the pixel electrode. In order to increase the current capacity of an electrode, the electrode may be thickened or the width of the line of the electrode the may be enlarged. However, if the electrode is thickened (to an extent of approximately several μm), a remaining stress occurs inside the electrode, which might cause a crack in the electrode or a base layer.

As mentioned above, according to the present invention, since the width of the line of the source electrode and the drain electrode of the element B (driving TFT) can be enlarged, the current capacity of the source electrode and the drain electrode of the element B can be increased without thickening the electrode.

Further, the gate electrode of the element A set on the same plane as the source electrode and the drain electrode of the element B does not need a large current capacity. Thus, by making the width of the line of the gate electrode of the element A small, the width of the line of the source electrode and the drain electrode of the element B can be further enlarged.

As mentioned above according to the OEL device of the present invention, a step of forming a contact hole in a manufacturing process (etching or cleaning) can be omitted, and its yield can be improved. Further, according to the OEL device of the present invention, an OEL display with high response can be provided.

(5) OEL Element

As mentioned above, in the OEL device of the present invention, the drain electrode of the element B is connected to the OEL element. The OEL element included in the OEL device of the present invention may be either of a top emission type or a bottom emission type but it is preferably of a top emission type.

The OEL element has a pair of pixel electrodes composed of an anode and a cathode and an organic light emitting layer set between the pixel electrodes, and may also have a hole transport layer, an electron transport layer and the like.

2. OEL Display of the Present Invention

An OEL display may be manufactured by arranging a plurality of the OEL devices of the present invention in a matrix state on a single substrate.

In the OEL display of the present invention, the respective electrodes of the element A and the element B may be formed in the matrix state or in a line state. The OEL display of the present invention may also have a scanning electrode line, a common electrode line and a data electrode line. The scanning electrode line is connected to the gate electrodes of the aligned plurality of elements A (switching TFT), and supplies current to the gate electrode of the element A. The common electrode line is connected to the source electrodes of the aligned plurality of the elements B (driving TFT), and supplies current to the source electrode of the element B. The data electrode line is connected to the source electrodes of the aligned plurality of elements A, and supplies current to the source electrode of the element A (See FIG. 4).

In the OEL display of the present invention, magnitude of potential applied to the respective electrodes of the element A and the element B is not particularly limited but for example, the potential applied to the gate electrode of the element A is −5 to +20V, the potential applied to the source electrode of the element A is 0 to 10V, and the potential applied to the drain electrode of the element A is 0 to 10V. The potential applied to the gate electrode of the element B is 0 to 10V, the potential applied to the source electrode of the element B is −5 to +2 V, and the potential applied to the drain electrode of the element B is 12V.

Figure 4:
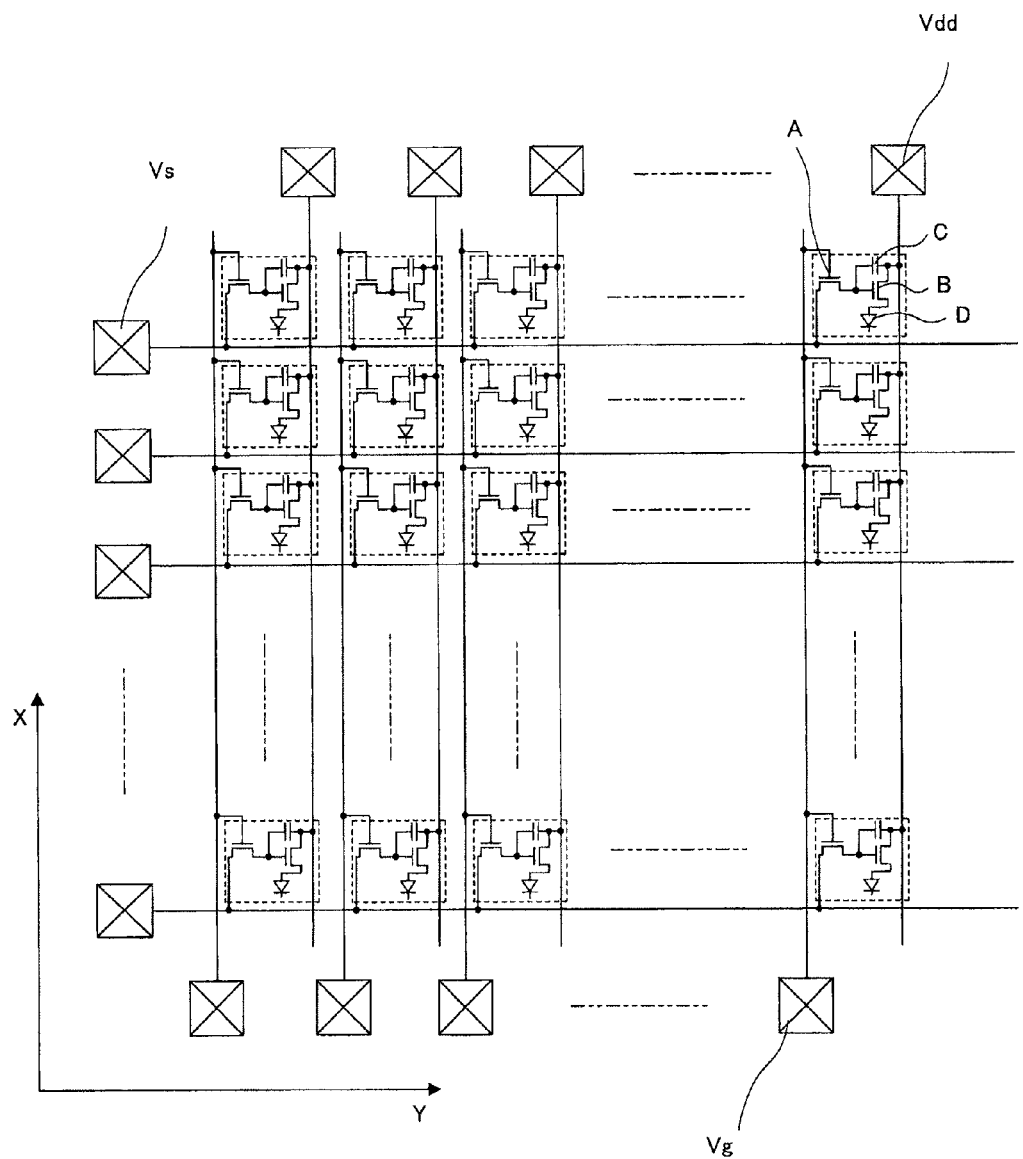
FIG. 4 is a circuit diagram of an OEL display of the present invention.

FIG. 4 shows a circuit diagram of the OEL display of the present invention.

In FIG. 4, reference character Vg denotes the scanning electrode line, Vdd denotes the common electrode line, and Vs denotes the data electrode line. Reference character A denotes the element A (switching TFT), B denotes the element B (driving TFT), C denotes capacitor and D denotes the OEL element. The capacitor has a function to stabilize the potential of the gate electrode of the driving TFT.

As shown in FIG. 4, the scanning electrode line and the common electrode line are parallel to the X axis in the figure. On the other hand, the data electrode line is parallel to the Y axis in the figure. Further, the X axis and the Y axis bisect each other at right angles. Moreover, the scanning electrode line and the common electrode line are formed on the same plane, and the data electrode line is set nearer the substrate than the scanning electrode line and the common electrode line.

As mentioned above, according to the present invention, the scanning electrode line and the common electrode line can be made parallel to each other on the same plane, which can provide a new pattern of bus line.

The capacitor is preferably connected to the common electrode line as shown in FIG. 4.

By connecting the capacitor to the common electrode line and using the common electrode line as a control line, a pixel compensation circuit can be constituted wherein the number of line is reduced.

An embodiment of the present invention will be described below referring to the attached drawings. However, the embodiment described below does not limit a scope of the present invention.

First Embodiment

In the first embodiment, an OEL device in which the switching TFT (element A) is a top-gate type TFT and the driving TFT (element B) is a bottom-gate type TFT will be described. The semiconductor layer in the first embodiment is a silicon based semiconductor layer or a compound semiconductor layer.

Figure 5:
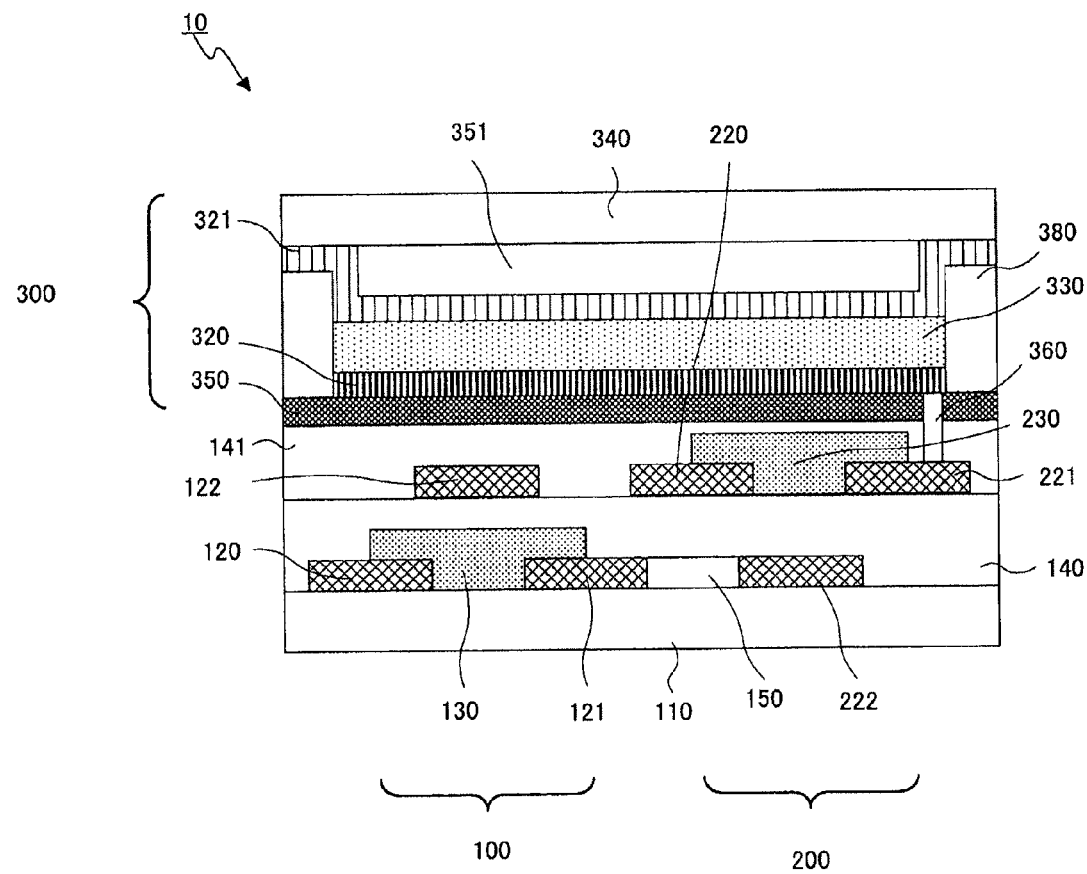
FIG. 5 is a sectional view of the OEL device of a first embodiment of the present invention.

FIG. 5 shows a sectional view of the OEL device of the first embodiment.

1. OEL Device of the First Embodiment

In FIG. 5, the OEL device 10 has a switching TFT 100, a driving TFT 200, and an OEL element 300.

The switching TFT 100 is a top-gate type TFT. The switching TFT 100 has a substrate 110, a source electrode 120, a drain electrode 121, a semiconductor layer 130, a gate insulating film 140, and a gate electrode 122.

In the top-gate type switching TFT 100, the source electrode 120 and the drain electrode 121 are set on the substrate 110, the gate insulating film 140 is set on the source electrode 120, the drain electrode 121 and the semiconductor layer 130, and the gate electrode 122 is set on the gate insulating film. The semiconductor layer 130 in this embodiment is a silicon based semiconductor layer or a compound semiconductor layer.

The drain electrode 121 of the switching TFT 100 is connected to a gate electrode 222 of the driving TFT 200 on the substrate 110 through a contract portion 150.

The driving TFT 200 is a bottom-gate type TFT. The driving TFT 200 shares the substrate 110 and the gate insulating film 140 with the switching TFT 100 and has a source electrode 220, a drain electrode 221, a semiconductor layer 230, and the gate electrode 222.

In the bottom-gate type driving TFT 200, the gate electrode 222 is set on the substrate 110, the gate insulating film 140 is set on the gate electrode 222, and the source electrode 220 and the drain electrode 221 are set on the gate insulating film 140.

As mentioned above, the gate electrode 222 of the driving TFT 200 is connected to the drain electrode 121 of the switching TFT 100 on the same plane of the substrate 110.

As mentioned above in this embodiment, the drain electrode of the switching TFT and the gate electrode of the driving TFT are set on the same substrate plane and connected.

On the switching TFT 100 and the driving TFT 200, an overcoat layer 141 is provided. The overcoat layer 141 has a function to promote electron movement in the semiconductor layer and a function to protect the semiconductor layer from oxygen and steam in the air.

Examples of a material of the overcoat layer 141 include polyimide, polyimidesiloxane, methylsiloxane, phenylsiloxane, polystyrene resin and the like.

The OEL element 300 has an anode 320, an organic light emitting layer 330, a cathode 321, a seal film 340, a flattening layer 350, a contact hole 360, a flattening film 351, and a bank 380. The OEL element 300 in this embodiment is a top-emission type light emitting element.

The flattening layer 350 is an insulating layer set on the overcoat layer 141. The flattening film layer 350 provides a flat plane on which the anode 320, which will be described later, is set. By setting the anode 320 on the flat plane, the flat anode 320 can be obtained. That is, by the flattening layer 350, if the anode 320 is a reflective anode, for example, a flat reflective anode that does not reflect light at random but reflects it in a given direction can be obtained.

Examples of a material of the flattening layer 350 include an acrylic resin, BCB resin, novolac resin and the like. The flattening layer 350 is formed by a spin coating method, for example.

The flattening layer 350 has the contact hole 360 for connecting the drain electrode 221 of the driving TFT 200 and the anode 320 of the OEL element 300. The contact hole 360 may be formed by a photolithography method if the material of the flattening layer 350 and the overcoat layer 141 is a photo-sensitive resin, or may be formed by a dry etching method if the material of the flattening layer 350 is not a photo-sensitive resin. By sputtering a conductive member such as metal onto the contact hole 360, a conductive layer for connecting the drain electrode 221 and the anode 320 is formed.

The anode 320 is a conductive layer set on the flattening layer 350. As mentioned above, the anode 320 is connected to the drain electrode 221 of the driving TFT 200 through the contact hole 360. Since the OEL element 300 is a top emission type, the anode 320 is preferably a reflective anode made of silver or the like.

The organic light emitting layer 330 contains an organic light emitting material. Examples of the organic light emitting material contained in the organic light emitting layer 330 include polyphenylenevinylene and its derivative, polyacetylene and its derivative, polyphenylene and its derivative, poly (para-phenylene ethylene) and its derivative, poly3-hexylthiophene and its derivative, polyfluorene and its derivative and the like. The organic light emitting layer may further include hole injection layer, intermediate layer, electron transport layer and the like.

The organic light emitting layer 330 is formed by applying an organic light emitting material in a region defined by the bank 380, for example.

The cathode 321 is a conductive layer set on the organic light emitting layer 330. The cathode 321 is preferably made of a material transmitting light. On the cathode 321, the flattening film 351 is further set. The material and manufacturing method of the flattening layer 351 may be the same as those of the flattening layer 350.

The seal film 340 is a film for protecting the anode 320, the organic light emitting layer 330, and the cathode 321 from moisture, heat, impact and the like. The seal film 340 is set on the flattening layer 351. Examples of the material of the seal film 340 include $Si_3N_4$, SiON, $SiO_2$ and the like, and $Si_3N_4$ is particularly preferable. The seal film 340 may be formed by laminating a film made of such materials. A preferable thickness of the seal film 500 is 20 to 200 nm.

The bank 380 defines the region of the organic light emitting layer 330. A material of the bank 380 is polyimide, polyacryl and the like, for example.

2. Manufacturing Method of the OEL Device of the First Embodiment

The manufacturing method of the OEL device 10 is not particularly limited, but has steps of, for example:

1) providing the substrate 110;

2) forming the source electrode 120 and the drain electrode 121 of the switching TFT 100, the gate electrode 220 of the driving TFT 200, and the contact portion 150 on the same plane of the substrate;

3) forming the semiconductor layer 130 connecting the source electrode 120 and the drain electrode 121 of the switching TFT 100;

4) forming the gate insulating film 140 on the source electrode 120, the drain electrode 121, and the semiconductor electrode 130 of the switching TFT 100 and the gate electrode 222 of the driving TFT;

5) forming the gate electrode 122 of the switching TFT 100, and the source electrode 220 and the drain electrode 221 of the driving TFT 200 on the gate insulating film 140;

6) forming the semiconductor layer 230 for connecting the source electrode 220 and the drain electrode 221 of the driving TFT 200 and forming the overcoat layer 141; and 7) manufacturing the OEL element 300 connected to the drain electrode 221.

Figure 6A:
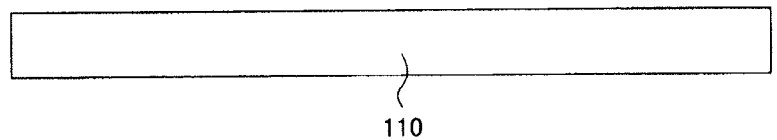
FIG. 6 is a diagram illustrating a manufacturing process of the OEL device of the first embodiment of the present invention.

In the 1) step, the substrate 110 made of the material as mentioned above is provided (FIG. 6A).

Figure 6B:
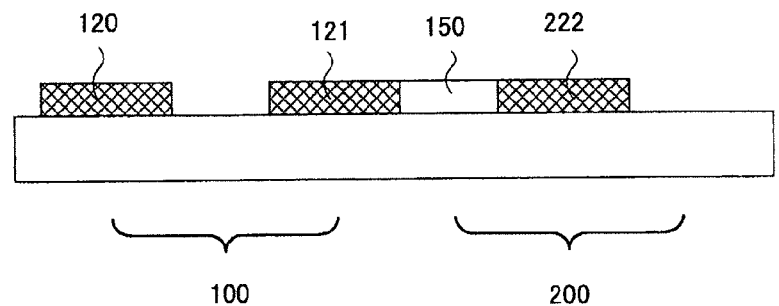

In the 2) step, on the provided substrate 110, the source electrode 120 and the drain electrode 121 of the switching TFT 100, the contact portion 150, and the gate electrode 222 of the driving TFT 200 are formed by sputtering method or heating deposition method, for example (FIG. 6B).

As mentioned above in the present invention, the source electrode and the drain electrode of the switching TFT and the gate electrode of the driving TFT are set on the same plane so that formation of the source electrode and the drain electrode of the switching TFT and the gate electrode of the driving TFT, and connection of the drain electrode of the switching TFT and the gate electrode of the driving TFT can be effected in a single step.

Figure 6C:
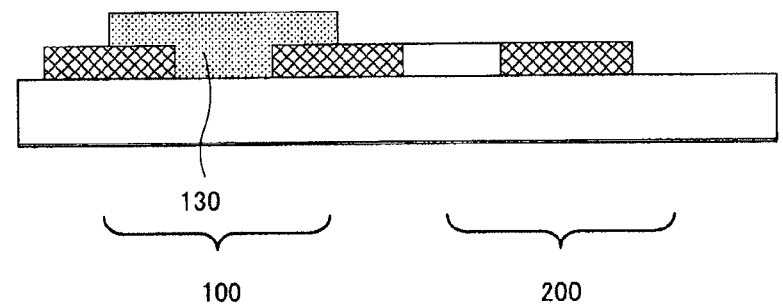

In the 3) step, the semiconductor layer 130 for connecting the source electrode 120 and the drain electrode 121 of the switching TFT 100 is formed (FIG. 6C). If the semiconductor layer 130 is a silicon based semiconductor layer, the semiconductor layer 130 is formed by the CVD method, for example. If the semiconductor layer 130 is a compound semiconductor layer, the semiconductor layer 130 is formed by a gas phase method such as CVD method and sputtering method, or a liquid phase method such as sol-gel method and solution method.

Figure 6D:
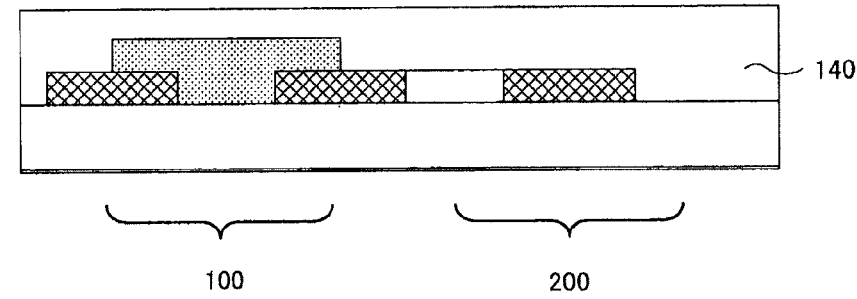

In the 4) step, the gate insulating film 140 is formed on the source electrode 120, the drain electrode 121, the semiconductor layer 130 of the switching TFT 100 and the gate electrode 222 of the driving TFT 200 (FIG. 6D). If the material of the gate insulating film 140 is an inorganic substance such as silicon oxide or silicon nitride, the gate insulating film 140 is formed by sputtering method, CVD method, ALD (Atomic Layer Deposition) method, heat oxidation method, dry etching and the like. On the other hand, if the material of the gate insulating film 140 is an organic substance such as polyimide, the gate insulating film 140 may be formed by coating method, photolithography method and the like.

Figure 6E:
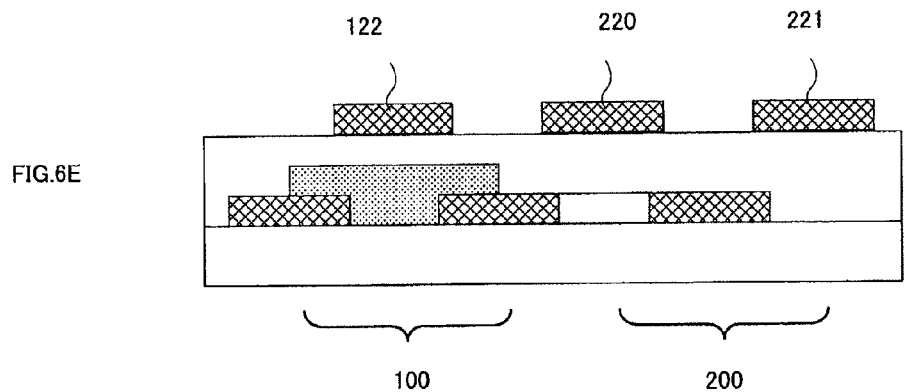

In the 5) step, on the gate insulating film 140, the gate electrode 122 of the switching TFT 100 and the source electrode 220 and the drain electrode 221 of the driving TFT 200 are formed by sputtering method or heating deposition method, for example (FIG. 6E)

Figure 6F:
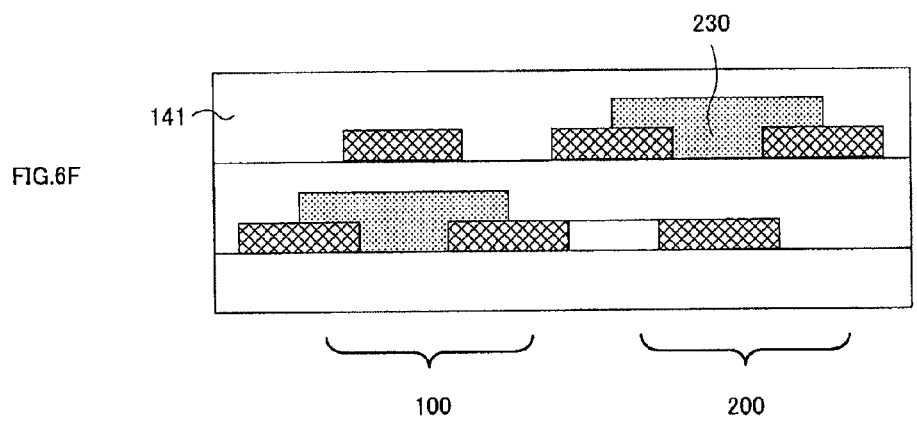

In the 6) step, the semiconductor layer 230 for connecting the source electrode 220 and the drain electrode 221 of the driving TFT 200 is formed, and the overcoat layer 141 is formed by the spin coating method, for example (FIG. 6F). The forming method of the semiconductor layer 230 may be the same as the forming method of the semiconductor layer 130.

Figure 6G:
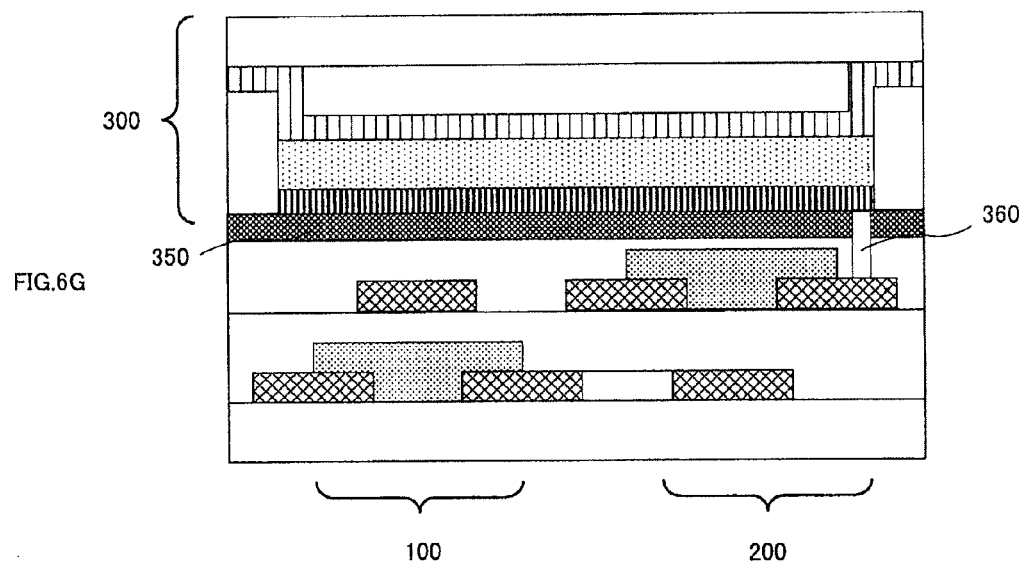

In the 7) step, the OEL element 300 is formed on the completed switching TFT 100 and the driving TFT 200 (FIG. 6G).

The method of forming the OEL element 300 may have steps of, for example, a) forming the flattening film 350 on the overcoat layer 141 by spin coating method, for example; b)

forming the contact hole 360 using photolithography method, dry etching method or the like; c) connecting the gate electrode 221 and the anode 320 through the contact hole 360; and d) forming the organic light emitting layer 330, the cathode 321, the flattening film 351, and the seal film 340 on the anode 320.

Second Embodiment

In the first embodiment, the OEL device in which the semiconductor is the silicon based semiconductor layer or compound semiconductor layer has been described. In the second embodiment, the OEL device in which the semiconductor layer is an organic semiconductor layer formed by coating method will be described.

Figure 7:
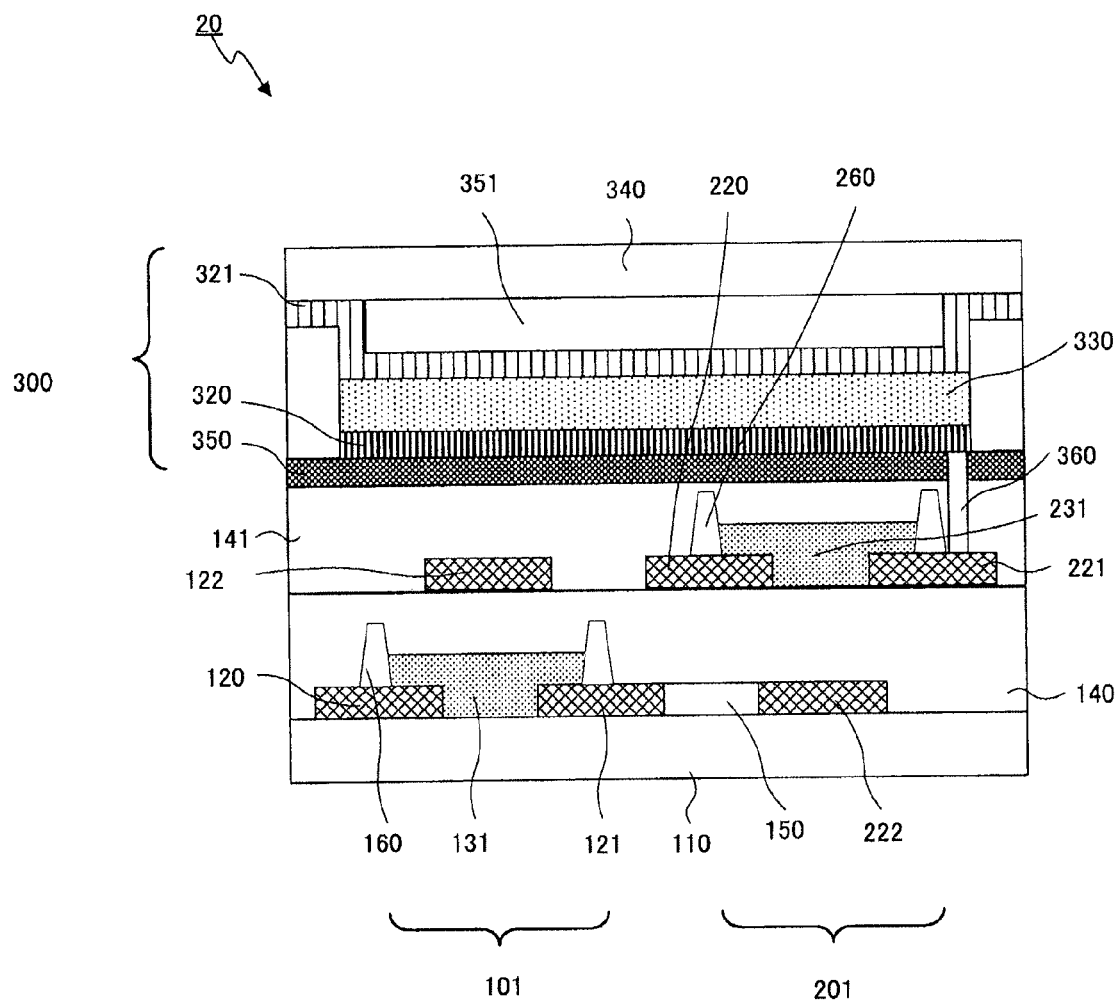
FIG. 7 is a sectional view of the OEL device of a second embodiment of the present invention.

FIG. 7 shows a sectional view of the OEL device of the second embodiment.

1. OEL Device in the Second Embodiment

In the OEL device 20 in the second embodiment, components other than a semiconductor layer 131 of a switching TFT 101, a semiconductor layer 231 of a driving TFT 201, banks 160 and 260 are the same as those of the OEL device 10 in the first embodiment. The same reference numerals are given to the same components as the components in the OEL device 10 and the description will be omitted.

The switching TFT 101 has the bank 160 on the source electrode 120 and the drain electrode 121. The semiconductor layer 131 is set in a region defined by the bank 160. The material of the semiconductor layer 131 is preferably fluorene-thiophene copolymer (F8T2), oligothiophene, pentacene, rubrene and the like, for example, and rubrene is particularly preferable.

The driving TFT 201 has the bank 260 on the source electrode 220 and the drain electrode 221. The semiconductor layer 231 is set in the region defined by the bank 260. The material of the semiconductor layer 231 is preferably tetrabenzoporphyrin, for example.

As mentioned above in this embodiment, the organic semiconducting material contained in the semiconductor layer of the switching TFT and the organic semiconducting material contained in the semiconductor layer of the driving TFT are preferably different from each other.

In the OEL device 20, the drain electrode 121 of the switching TFT 101 and the gate electrode 222 of the driving TFT 201 are set on the same plane of the substrate 110 of the insulating film 140 and connected to each other.

2. Manufacturing Method of the OEL Device of the Second Embodiment

The manufacturing method of the OEL device 20 has steps of, for example:

1) providing the substrate 110;
2) forming the source electrode 120 and the drain electrode 121 of the switching TFT 101, the gate electrode 222 of the driving TFT 201, and the contact portion 150 on the same plane of the substrate 110;
3) setting the bank 160 on the source electrode 120 and the drain electrode 121 of the switching TFT 101;
4) forming the semiconductor layer 131 in the region defined by the bank 160;
5) forming the gate insulating film 140 on the gate electrode 222 of the driving TFT 201, the source electrode 120, the drain electrode 121, and the semiconductor layer 131 of the switching TFT 101;
6) forming the gate electrode 122 of the switching TFT 101, and the source electrode 220 and the drain electrode 221 of the driving TFT 201 on the same plane of the gate insulating film 140;
7) setting the bank 260 on the source electrode 220 and the drain electrode 221 of the driving TFT 201; and
8) forming the semiconductor layer 231 in the region defined by the bank 260 and forming the overcoat layer 141.

Figure 8A:
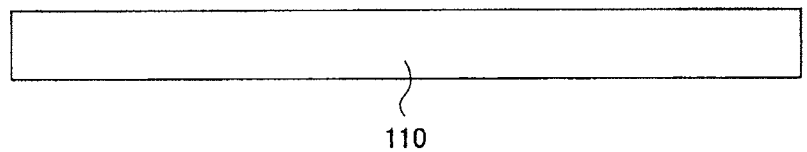
FIG. 8 is a diagram illustrating a manufacturing process of the OEL device of the second embodiment of the present invention.

In the 1) step, the substrate 101 made of the material as mentioned above is provided (FIG. 8A).

Figure 8B:
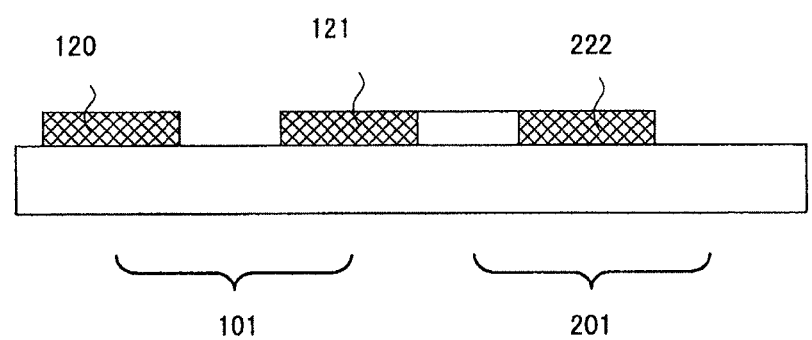

In the 2) step, on the provided substrate, the source electrode 120 and the drain electrode 121 of the switching TFT 101, the gate electrode 222 of the driving TFT 201, and the contact portion 150 are formed by sputtering method or heating deposition method, for example (FIG. 8B).

As mentioned above, in the present invention, the source electrode and the drain electrode of the switching TFT and the gate electrode of the driving TFT are set on the same plane so that formation of the source electrode and the drain electrode of the switching TFT and the gate electrode of the driving TFT, and connection of the drain electrode of the switching TFT and the gate electrode of the driving TFT can be effected in a single step.

Figure 8C:
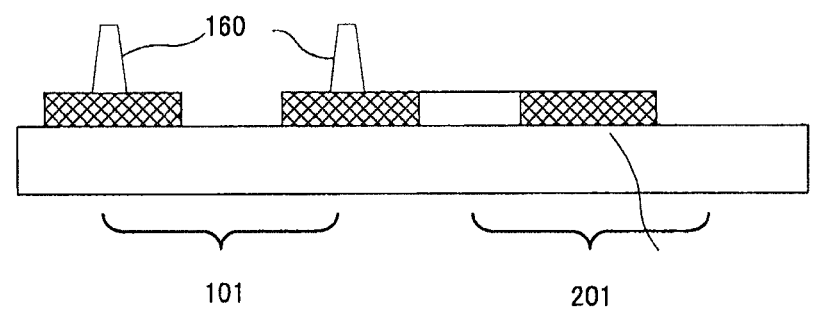

In the 3) step, the bank 160 is formed on the source electrode 120 and the drain electrode 121 of the switching TFT 101. The bank 160 may be formed by gravure printing, for example (FIG. 8C).

The bank is set on the electrodes in this embodiment, but the bank may be set on the substrate outside the electrodes.

Figure 8D:
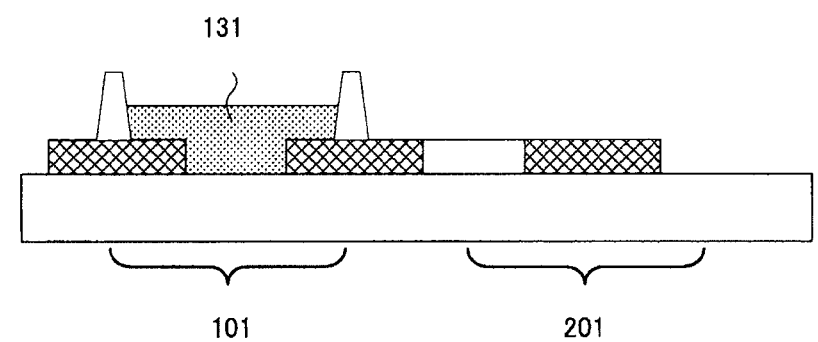

In the 4) step, the semiconductor layer 131 is formed in the region defined by the bank 160 between the source electrode 120 and the drain electrode 121 of the switching TFT 101. The semiconductor layer 131 is formed by applying a non-aqueous solution containing an organic semiconducting material in the non-aqueous solvent by ink jet method or dispenser method, drying and crystallizing it, for example (FIG. 8D).

The organic semiconducting material immediately after the application in the region defined by the bank is droplets in a stilliform but they become gradually flattened with drying.

Figure 8E:
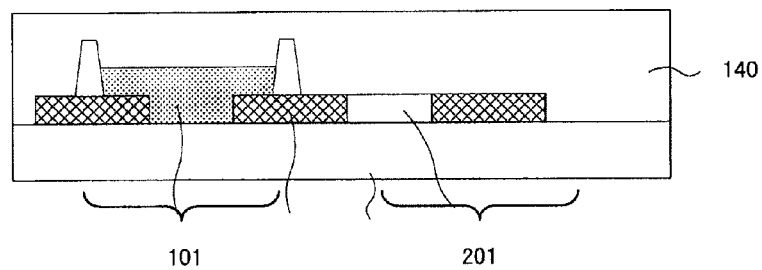

In the 5) step, the gate insulating film 140 is formed on the source electrode 120, the drain electrode 121, the semiconductor layer 131 of the switching TFT 101 and the gate electrode 222 of the driving TFT 201 (FIG. 8E). If the material of the gate insulating film 140 is an inorganic substance such as silicon oxide or silicon nitride, the gate insulating film 140 is formed by sputtering method, CVD method, ALD (Atomic Layer Deposition) method, heat oxidation method, dry etching and the like. On the other hand, if the material of the gate insulating film 140 is an organic substance such as polyimide, the gate insulating film 140 may be formed by coating method, photolithography method and the like.

Figure 8F:
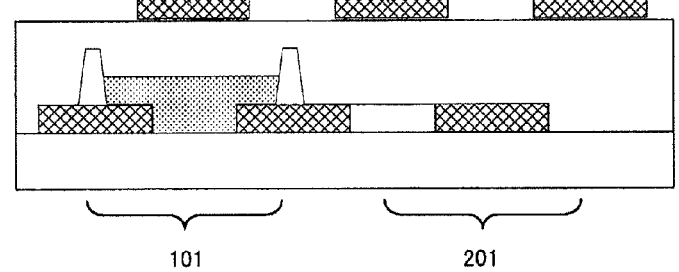

In the 6) step, on the gate insulating film 140, the gate electrode 122 of the switching TFT 101 and the source electrode 220 and the drain electrode 221 of the driving TFT 201 are formed by sputtering method or heating deposition method, for example (FIG. 8F).

As mentioned above, in the present invention, by setting the source electrode and the drain electrode of the switching TFT and the gate electrode of the driving TFT on the same plane, formation of the source electrode and the drain electrode of the switching TFT and the gate electrode of the driving TFT can be effected in a single step.

Figure 8G:
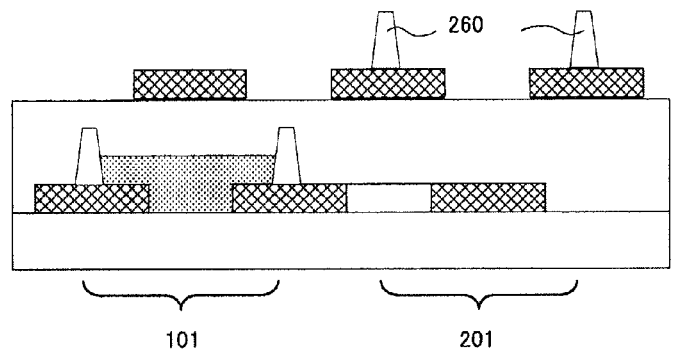

In the 7) step, on the source electrode 220 and the drain electrode 221 of the driving TFT 201, the bank 260 is formed by gravure printing method, for example (FIG. 8G).

The forming method of the bank 260 may be the same as the forming method of the bank 160.

Figure 8H:
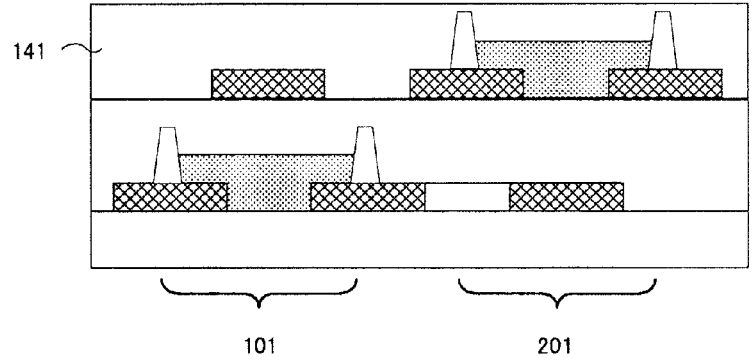

In the 8) step, the semiconductor layer 231 is formed in the region defined by the bank 260 (FIG. 8H). The forming method of the semiconductor layer 231 may be the same as the forming method of the semiconductor layer 131. After that, on the switching TFT 101 and the driving TFT 201, the overcoat layer 141 is formed by the spin coating method, for example.

After that, the OEL element 300 connected to the drain electrode 221 may be manufactured by the method described in the first embodiment, for example.

Third Embodiment

In the first embodiment and the second embodiment, the OEL device in which the switching TFT is of the top-gate type and the driving TFT is of the bottom-gate type has been described. In the third embodiment, an organic semiconductor device in which the switching TFT is of the bottom-gate type and the driving TFT is of the top-gate type will be described. Further, in this embodiment, the organic semiconductor device will be described without showing the OEL element. Moreover, a material of the semiconductor layer in this embodiment is an organic semiconducting material.

1. Semiconductor Device in a Third Embodiment

FIG. 9 shows a sectional view of a semiconductor device of the third embodiment.

In the description of an organic semiconductor device 30 in the third embodiment, the same reference numerals are given to the same components as those in the OEL device 20 and the description will be omitted.

The organic semiconductor device 30 has a bottom-gate type switching TFT 102 and a top-gate type driving TFT 202. The drain electrode 121 of the switching TFT 102 and the gate electrode 222 of the driving TFT 202 are connected on the same plane of the insulating film 140 through the contact portion 150.

Figure 10A:
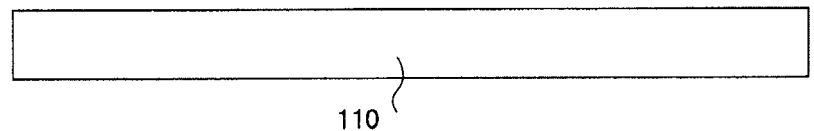
FIG. 10 is a diagram illustrating a manufacturing process of the OEL device of the third embodiment of the present invention.
Figure 10B:
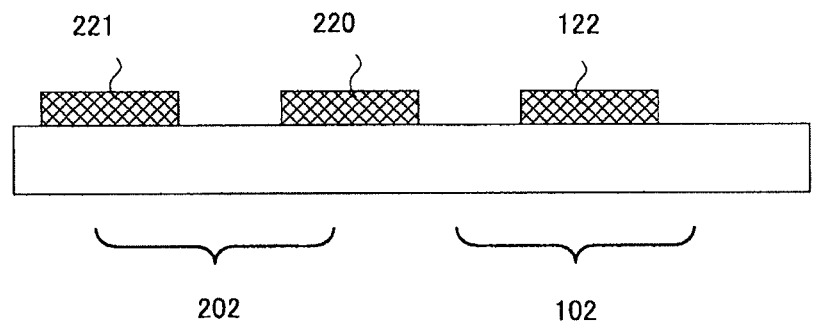
Figure 10C:
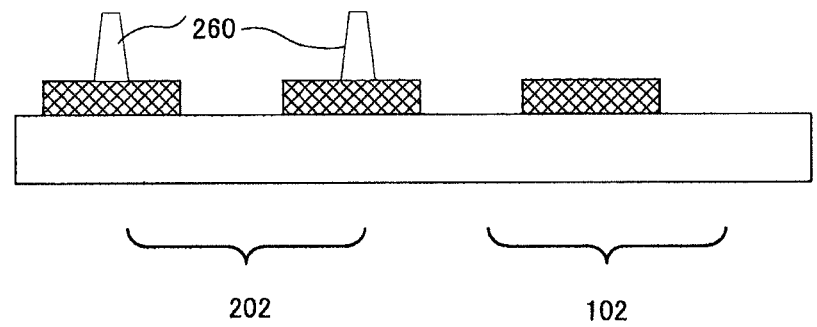
Figure 10D:
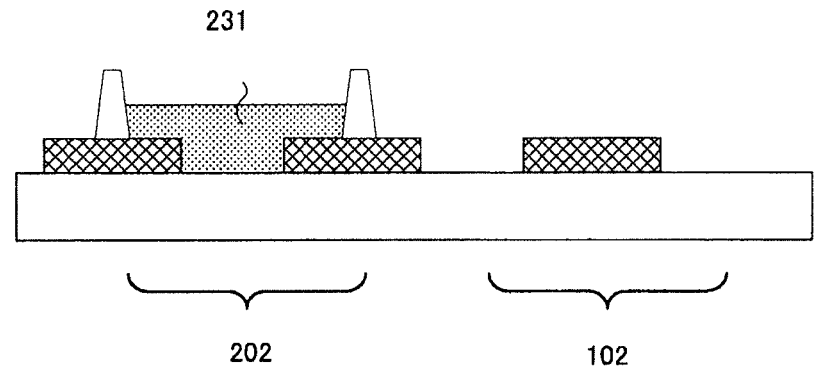
Figure 10E:
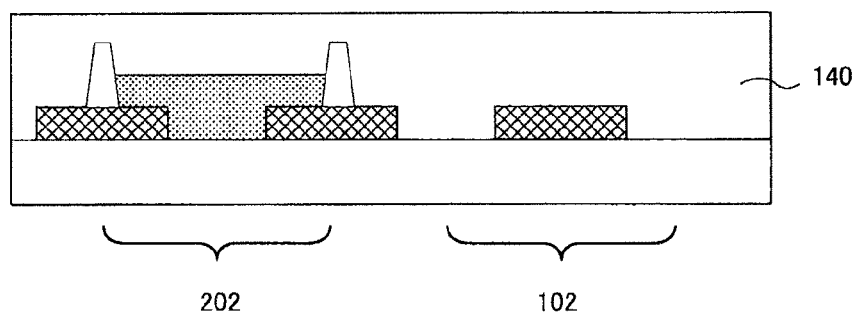
Figure 10F:
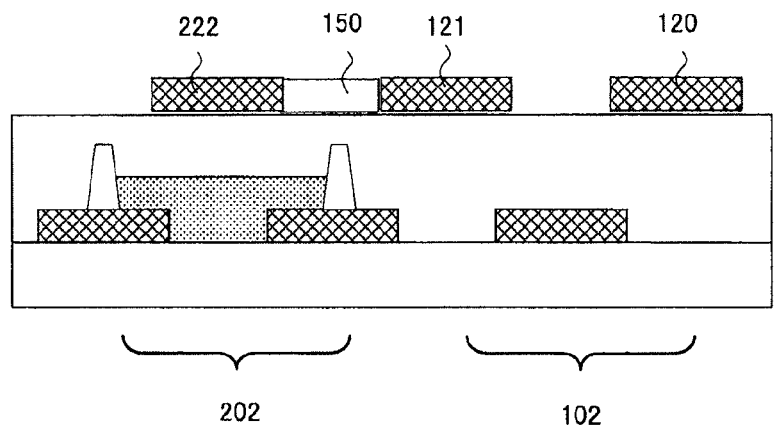
Figure 10G:
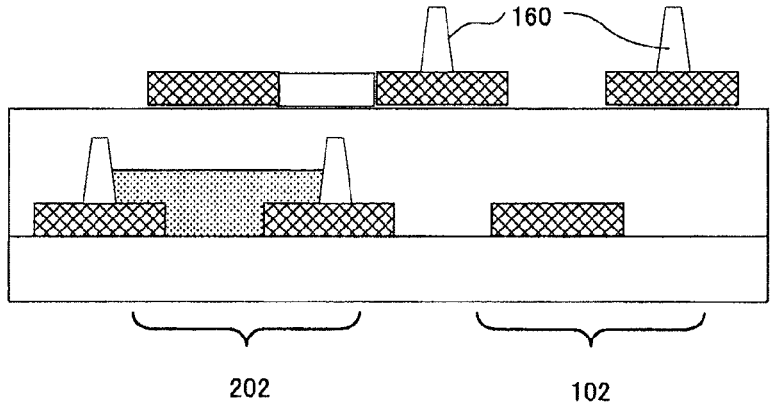
Figure 10H:
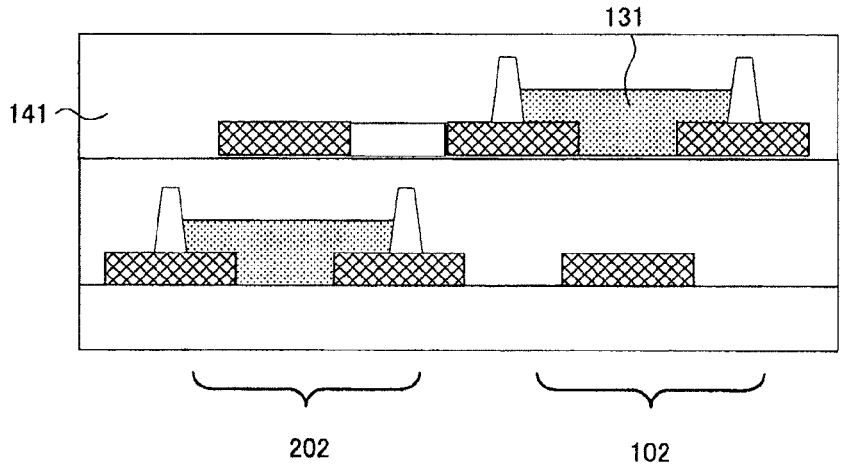

2. Manufacturing Method of the Organic Semiconductor Device in the Third Embodiment The manufacturing method of the organic semiconductor device 30 has steps of, for example:

1) providing the substrate 110 (FIG. 10A);

2) forming the gate electrode 122 of the switching TFT 102, the source electrode 220 and the drain electrode 221 of the driving TFT 202 on the same plane of the substrate 110 (FIG. 10B);

3) setting the bank 260 on the source electrode 220 and the drain electrode 221 of the driving TFT 202 (FIG. 10C);

4) forming the semiconductor layer 231 in the region defined by the bank 260 (FIG. 10D);

5) forming the gate insulating film 140 on the gate electrode 122 of the switching TFT 102, and the source electrode 220, the drain electrode 221, and the semiconductor layer 231 of the driving TFT 202 (FIG. 10E);

6) forming the source electrode 120 and the drain electrode 121 of the switching TFT 102, the gate electrode 222 of the driving TFT 201, and the contact portion 150 on the same plane of the gate insulating film 140 (FIG. 10F);

7) setting the bank 160 on the source electrode 120 and the drain electrode 121 of the switching TFT 102 (FIG. 10F); and 8) forming the semiconductor layer 131 in the region defined by the bank 160 and forming the overcoat layer 141.

The manufacturing method of the respective components may be the same as the method described in the second embodiment.

The present application claims priority based on Japanese Patent Application No. 2007-144807 filed on May 31, 2007. The contents described in the application description are all incorporated herein.

INDUSTRIAL APPLICABILITY

The OEL device and manufacturing method thereof of the present invention can be used not only as an OEL display, for example, but also can be suitably used as a display portion in various electronic equipment including a portable information processing device such as a word processor, personal computer and the like, a wrist-watch type electronic device and the like.

The invention claimed is:

1. An organic EL device comprising:
   a semiconductor element A having a source electrode, a drain electrode, a semiconductor layer and a gate electrode;
   a semiconductor element B having a source electrode, a drain electrode, a semiconductor layer and a gate electrode connected to the source electrode or the drain electrode of said element A; and
   an organic EL element having a pixel electrode connected to the drain electrode of said element B, wherein
   the source electrode and the drain electrode of said element A and the gate electrode of said element B are set on the same plane,
   the semiconductor layer of at least one of said element A and said element B is defined within a region at and between the source electrode and the drain electrode of said element A or said element B,
   the pixel electrode is placed above said element A and said element B.

2. The organic EL device according to claim 1, wherein said element A is a top-gate type TFT and said element B is a bottom-gate type TFT.

3. The organic EL device according to claim 1, wherein said element A is a bottom-gate type TFT and said element B is a top-gate type TFT.

4. The organic EL device according to claim 1, wherein the semiconductor layer of said element A or said element B contains silicon.

5. The organic EL device according to claim 1, wherein the semiconductor layer of said element A or said element B contains an organic semiconducting material.

6. The organic EL device according to claim 1, wherein the semiconductor layers of said element A and said element B each contain an organic semiconducting material; and
   the organic semiconducting material contained in the semiconductor layer of said element A and the organic semiconducting material contained in the semiconductor layer of said element B are different from each other.

7. An organic EL display in which a plurality of the organic EL devices according to claim 1 are arranged in a matrix state on a single substrate; wherein
   a scanning electrode line connected to the gate electrode of each element A and
   a common electrode line connected to the source electrode of each element B are parallel to the X axis;
   a data electrode line connected to the source electrode of each element A is parallel to the Y axis; and
   the X axis and the Y axis bisect each other at right angle.

* * * * *